US012800627B2

(12) United States Patent
Nakamura et al.

(10) Patent No.: US 12,800,627 B2
(45) Date of Patent: Nov. 17, 2026

(54) VOLTAGE MEASUREMENT SYSTEM

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Kunihiko Nakamura, Nisshin (JP); Masaya Kondo, Nisshin (JP); Yoshikazu Furuta, Nisshin (JP); Tomohiro Nezuka, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 109 days.

(21) Appl. No.: 19/033,598

(22) Filed: Jan. 22, 2025

(65) Prior Publication Data

US 2025/0334616 A1 Oct. 30, 2025

(30) Foreign Application Priority Data

Apr. 25, 2024 (JP) ................................ 2024-071958

(51) Int. Cl.
*G01R 19/00* (2006.01)
*G01R 19/165* (2006.01)
*G01R 19/257* (2006.01)

(52) U.S. Cl.
CPC ..... *G01R 19/257* (2013.01); *G01R 19/16523* (2013.01)

(58) Field of Classification Search
CPC ........................ G01R 19/257; G01R 19/16523
See application file for complete search history.

(56) References Cited

U.S. PATENT DOCUMENTS

2011/0156811 A1* 6/2011 Shindo ............... H03F 3/45475 330/69
2012/0286717 A1* 11/2012 Fukuta ................... B60L 50/61 318/722

(Continued)

OTHER PUBLICATIONS

REF62xx High-Precision Voltage Reference With Integrated ADC Drive Buffer, Texas Instruments, Sep. 2016.

*Primary Examiner* — Thang X Le
(74) *Attorney, Agent, or Firm* — Posz Law Group, PLC

(57) ABSTRACT

A voltage measurement system includes a voltage reference circuit, an additional circuit, a first high-potential wiring, a first low-potential wiring, a second high-potential wiring, and a second low-potential wiring. The additional circuit receives a voltage based on a reference voltage generated by the voltage reference circuit. The additional circuit includes: a first circuit that receives a first voltage based on the reference voltage; and a second circuit that receives a second voltage based on the reference voltage. The first high-potential wiring and the first low-potential wiring are connected through the first circuit. The second high-potential wiring and the second low-potential wiring are connected through the second circuit. The first high-potential wiring and the second high-potential wiring are isolated from each other. The first low-potential wiring and the second low-potential wiring are isolated from each other.

7 Claims, 5 Drawing Sheets

(56) References Cited

U.S. PATENT DOCUMENTS

| | | | | |
|---|---|---|---|---|
| 2013/0121377 | A1* | 5/2013 | Furuichi | G01K 15/005 374/178 |
| 2014/0327431 | A1* | 11/2014 | Nakamura | G01R 31/42 324/130 |

* cited by examiner

VOLTAGE MEASUREMENT SYSTEM

CROSS REFERENCE TO RELATED APPLICATION

This application is based on Japanese Patent Application No. 2024-071958 filed on Apr. 25, 2024, the disclosure of which is incorporated herein by reference.

TECHNICAL FIELD

The present disclosure relates to a voltage measurement system.

BACKGROUND

In a voltage measurement system, a voltage generated by a voltage reference circuit may be supplied to another circuit. For example, in this voltage measurement system, the voltage generated by the voltage reference circuit may be supplied to an analog-to-digital converter (ADC) as the other circuit.

SUMMARY

The present disclosure describes a voltage measurement system including a voltage reference circuit, another circuit, a first high-potential wiring, a first low-potential wiring, a second high-potential wiring, and a second low-potential wiring.

DETAILED DESCRIPTION

Figure 1:
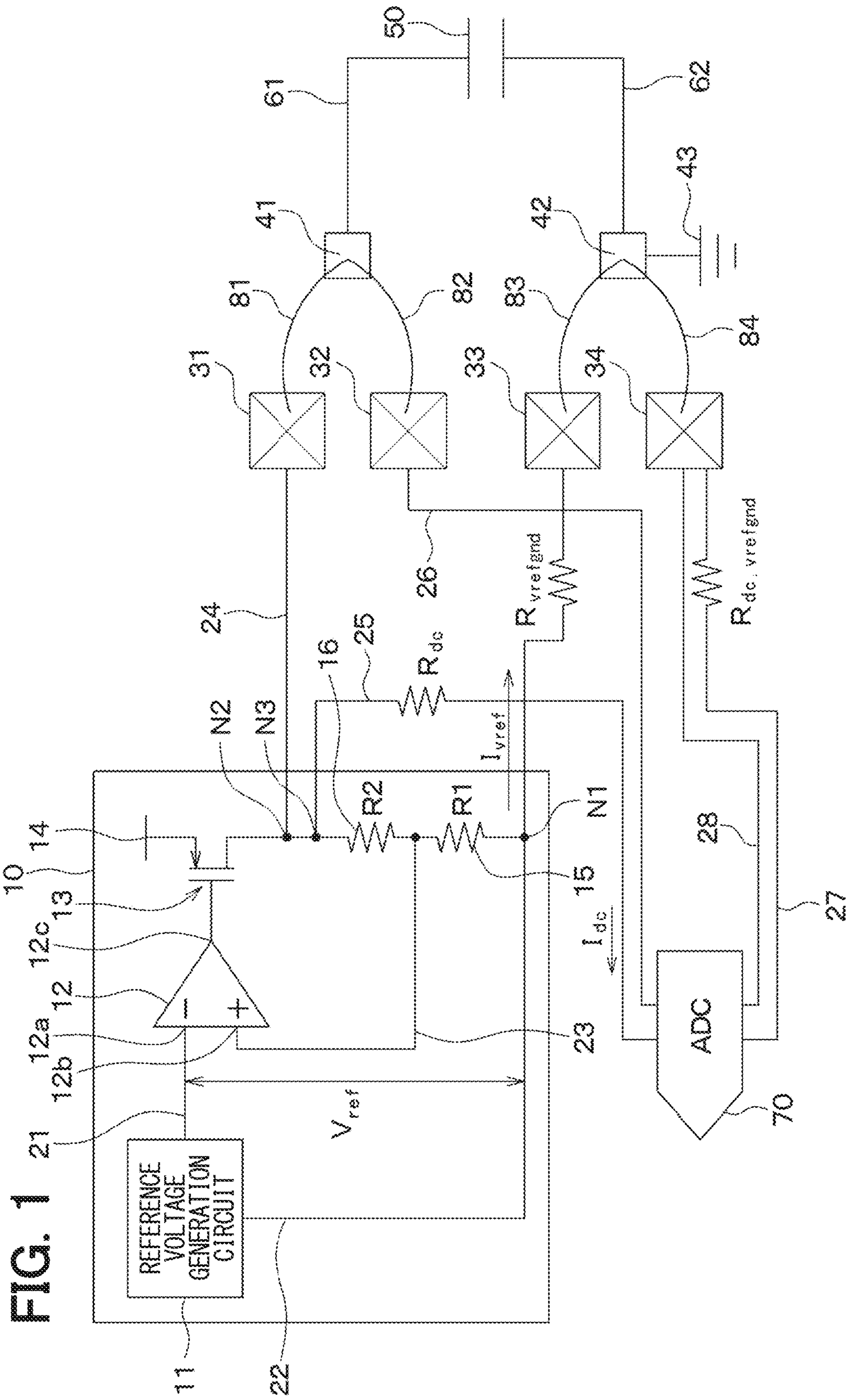
FIG. 1 is a schematic diagram of a voltage measurement system according to a first embodiment.

An ADC may include a first circuit, which contains a resistive voltage divider circuit where DC current is supplied, and a second circuit, which includes components such as a digital-to-analog converter (DAC) where AC current is supplied. The second circuit may also encompass functions for performing calculations. In a voltage measurement system, a voltage reference circuit and the first and second circuit of the ADC may be connected via a common wiring.

The linearity, which is an important characteristic of the ADC, may be susceptible to the voltage error supplied to the second circuit (i.e., the DAC). The accuracy may decrease when the voltage supplied to the second circuit varies. Therefore, it is desirable that the second circuit of the ADC be supplied with a more accurate voltage than that supplied to the first circuit.

However, in the above-mentioned voltage measurement system, the voltage reference circuit and the first and second circuits of the ADC are connected via a common wiring. Therefore, in the above-mentioned voltage measurement system, the wiring resistance drop (i.e., voltage drop) caused by the DC current supplied to the first circuit may result in voltage errors in the voltage supplied to the second circuit, which uses AC current as its load. In this case, it is possible to perform corrections in advance through inspection or other means to reduce the impact of the wiring resistance drop. However, if the DC current changes after the inspection, such corrections may become difficult.

According to an aspect of the present disclosure, a voltage measurement system includes a voltage reference circuit, an additional circuit, a first high-potential wiring, a first low-potential wiring, a second high-potential wiring, and a second low-potential wiring. The voltage reference circuit generates a reference voltage. The additional circuit receives a voltage based on the reference voltage. The additional circuit includes a first circuit and a second circuit. The first circuit receives a first voltage based on a reference voltage, and the second circuit receives a second voltage based on a reference voltage having a higher accuracy than the reference voltage in the first circuit. The first high-potential wiring and the first low-potential wiring are connected through the first circuit. The first high-potential wiring and the first low-potential wiring apply the first voltage to the first circuit. The second high-potential wiring and the second low-potential wiring are connected through the second circuit. The second high-potential wiring and the second low-potential wiring apply the second voltage to the second circuit. The first high-potential wiring and the second high-potential wiring are isolated from each other. The first low-potential wiring and the second low-potential wiring are isolated from each other.

Accordingly, the first high-potential wiring and the second high-potential wiring are isolated from each other, and the first low-potential wiring and the second low-potential wiring are also isolated from each other. Therefore, the second circuit is supplied with a second voltage that has reduced the impact of the wiring drop caused by the current flowing through the first circuit. This setup can prevent the second voltage supplied to the second circuit from being affected by the current flowing through the first circuit.

Embodiments of the present disclosure will be hereinafter described with reference to the drawings. In the following embodiments, the same or equivalent parts are denoted by the same reference numerals for description.

First Embodiment

The following describes a first embodiment with reference to the drawings. A voltage measurement system according to this embodiment, as shown in FIG. 1, includes, for example, a voltage reference circuit 10, first to fourth terminals 31 to 34, first and second capacitive terminals 41 and 42, a capacitor 50, and an ADC 70. In this embodiment, the voltage measurement system may be configured such that the voltage reference circuit 10, the first to fourth terminals 31 to 34, and the ADC 70 are all placed on a common integrated circuit (IC) chip. The first capacitive terminal 41, the second capacitive terminal 42, and the capacitor 50 are arranged as separate components on the wiring board on which the IC chip is mounted.

The voltage reference circuit 10 in this embodiment includes, for example, a reference voltage generation circuit 11, an operational amplifier 12, a control element 13, a first resistor 15, and a second resistor 16.

The reference voltage generation circuit 11 is connected to the first wiring 21 and the second wiring 22, and generates a reference voltage Vref corresponding to the potential difference between the first wiring 21 and the second wiring 22. The first wiring 21 is connected to the inverting input terminal 12*a* of the operational amplifier 12, while the second wiring 22 is connected to the third terminal 33, which will be described later. In this embodiment, the second wiring 22 includes a portion of the wiring that is disposed within the voltage reference circuit 10 and connected to the reference voltage generation circuit 11, as well as a portion of the wiring that is connected to this internal wiring and extends outside the voltage reference circuit 10 to connect to the third terminal 33, which will be described later.

In this embodiment, the control element 13 includes, for example, a p-channel transistor. The source terminal of the control element 13 is connected to the internal power supply 14, and the gate terminal is connected to the output terminal 12*c* of the operational amplifier 12.

The first resistor 15 and the second resistor 16 are connected in series between the drain terminal of the control element 13 and the second wiring 22. A third wiring 23, which is connected to the non-inverting input terminal 12*b* of the operational amplifier 12, is connected between the first resistor 15 and the second resistor 16. A fourth wiring 24 and a fifth wiring 25 are connected between the control element 13 and the second resistor 16. The fourth wiring 24 includes a portion of the wiring that is disposed within the voltage reference circuit 10, and a portion of the wiring that is connected to this internal wiring and extends to connect to the first terminal 31, which will be described later. The fifth wiring 25 includes a portion of the wiring that is disposed within the voltage reference circuit 10, and a portion of the wiring that is connected to this internal wiring and extends to connect to the first circuit 71 of the ADC 70, which will be described later.

The operational amplifier 12 has its inverting input terminal 12*a* connected to the first wiring 21, its non-inverting input terminal 12*b* connected to the third wiring 23, and its output terminal 12*c* connected to the gate terminal of the control element 13, as described above.

The first to fourth terminals 31 to 34 are, for example, arranged on the outer edge side of the IC chip on which the voltage reference circuit 10 and the ADC 70 are mounted. The first terminal 31 is connected to the fourth wiring 24, which is connected between the control element 13 and the second resistor 16. The second terminal 32 is connected to the second circuit 72 of the ADC 70, which will be described later, via the sixth wiring 26.

The third terminal 33 is connected to the second wiring 22. The fourth terminal 34 is connected to the seventh wiring 27, which is connected to the first circuit 71 of the ADC 70, which will be described later, and is also connected to the eighth wiring 28, which is connected to the second circuit 72 of the ADC 70.

The first and second capacitance terminals 41 and 42 are, for example, arranged on a wiring board separately from the IC chip on which the voltage reference circuit 10 and the ADC 70 are mounted. The first capacitance terminal 41 is connected to the first terminal 31 and the second terminal 32 via bonding wires 81 and 82. The second capacitance terminal 42 is connected to the third terminal 33 and the fourth terminal 34 via bonding wires 83 and 84, and is also connected to the ground 43. In this embodiment, the ground 43 corresponds to a reference potential source. In this embodiment, an example is provided where the reference potential source is the ground 43, but the reference potential source does not necessarily have to be the ground 43, as long as it is maintained at a predetermined potential.

The capacitor 50 is arranged between the first external wiring 61, which is connected to the first capacitance terminal 41, and the second external wiring 62, which is connected to the second capacitance terminal 42. It should be noted that, in this embodiment, the capacitor 50 is arranged as a separate component from the IC chip on which the voltage reference circuit 10 and the ADC 70 are mounted, as described above. Therefore, it can be said to be an external capacitor. In this embodiment, the capacitor 50 corresponds to a capacitance unit.

Figure 2:
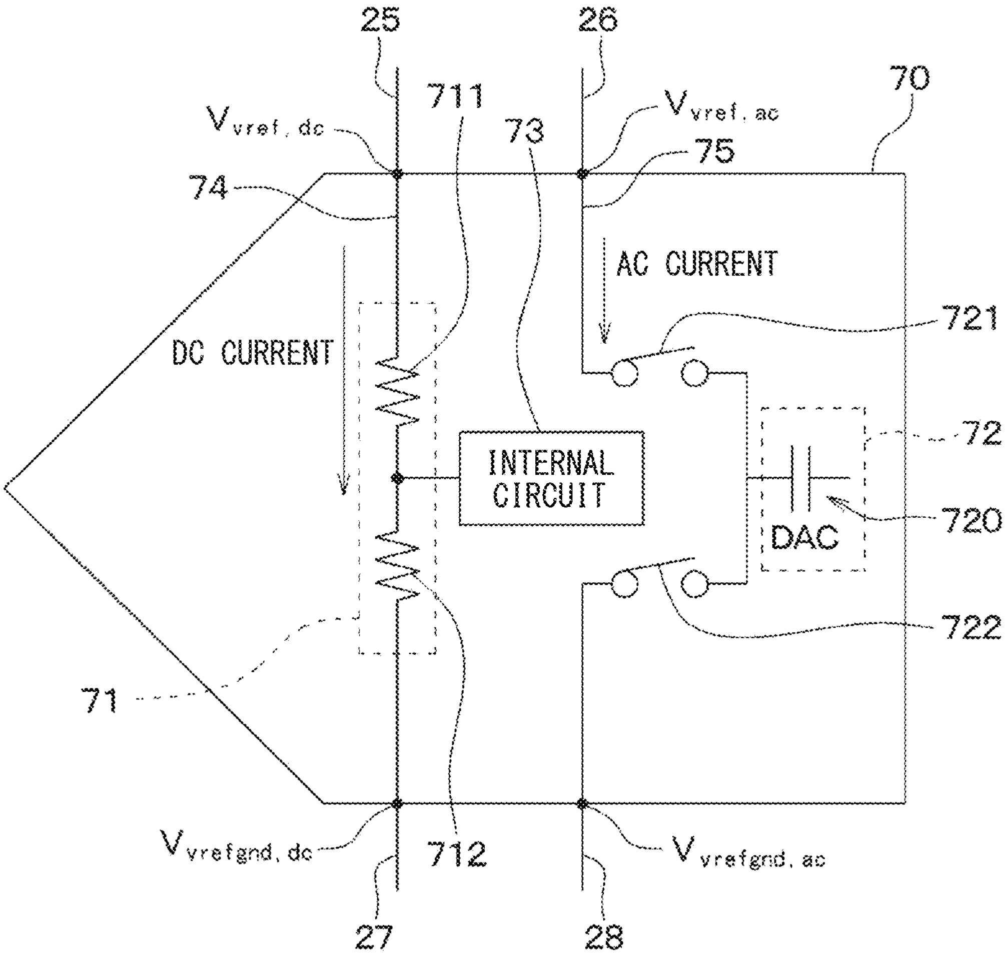
FIG. 2 is a schematic diagram of an ADC illustrated in FIG. 1.

In this embodiment, as shown in FIG. 2, the ADC 70 includes, for example, a first circuit 71, a second circuit 72, an internal circuit 73, a first internal wiring 74, and a second internal wiring 75, and generates a digital signal based on an analog signal provided from the outside and an output signal from the second circuit 72. In this embodiment, ADC 70 corresponds to a circuit.

In this embodiment, the first circuit 71 includes a resistive divider in which the first internal resistor 711 and the second internal resistor 712 are connected in series within the first internal wiring 74. In this embodiment, the midpoint between the first internal resistor 711 and the second internal resistor 712 of the first circuit 71 is connected to the internal circuit 73. The first circuit 71 generates a reference power supply to drive the internal circuit 73. The internal circuit 73 includes, for example, an operational amplifier that performs predetermined processing within the ADC 70. The first circuit 71 may also be referred to as a first circuit unit or a first subcircuit on some occasions.

The second circuit 72 includes a DAC 720 and includes a unit that provides an arithmetic function. The second circuit 72 is connected to the second internal wiring 75 via the first switch 721 and the second switch 722. In this embodiment, the arithmetic unit includes the DAC 720. The second circuit 72 may also be referred to as a second circuit unit or a second subcircuit on some occasions.

The first internal wiring 74 and second internal wiring 75 are isolated from each other in the ADC 70. The first internal wiring 74 has one end connected to the fifth wiring 25 and the other end connected to the seventh wiring 27. A DC voltage, which changes in addition to the voltage (for example, 5V) generated by the voltage reference circuit 10, is supplied when a DC current flows from the fifth wiring 25 side to the seventh wiring 27 side. The second internal wiring 75 has one end connected to the sixth wiring 26 and the other end connected to the eighth wiring 28. The second internal wiring 75, by appropriately controlling the on and off states of the first switch 721 and the second switch 722, allows an instantaneous current to flow from the capacitor 50 through the sixth wiring 26 to the eighth wiring 28 side. This results in an instantaneous AC voltage, which changes in addition to the voltage (for example, 5V) generated by the voltage reference circuit 10, being supplied. In this embodiment, the steady DC voltage supplied to the first circuit 71 corresponds to the first voltage, and the instantaneous AC voltage added to the DC voltage supplied to the second circuit 72 corresponds to the second voltage.

The above is the configuration of the voltage measurement system in this embodiment. In this embodiment, the fifth wiring 25 corresponds to a first high-potential wiring, and the sixth wiring 26 corresponds to a second high-potential wiring. In this embodiment, the seventh wiring 27 corresponds to a first low-potential wiring, and the eighth wiring 28 corresponds to a second low-potential wiring. In such a voltage measurement system, as described above, a DC current flows through the first circuit 71, and an instantaneous AC current flows through the second circuit 72 in response to the on and off states of the first switch 721 and the second switch 722. In this case, the second circuit 72

(i.e., DAC 720) constitutes the functions necessary for computation, calculation, or arithmetic operation, and it is possible that a high-precision voltage is supplied. Therefore, in this embodiment, as described above, the fifth wiring 25 and the seventh wiring 27 through which DC current flows are arranged separately from the sixth wiring 26 and the eighth wiring 28 through which AC current flows. In other words, the path through which the DC current flows is separated from the path through which the AC current flows. Therefore, it is possible to suppress the change in the voltage supplied to the second circuit 72 caused by the DC current supplied to the first circuit 71.

The following describes an example. In the following description, as shown in FIG. 1, the connection point between the first resistor 15 and the second wiring 22 is referred to as a first node N1, the connection point between the control element 13 and the second resistor 16 and the fourth wiring 24 is referred to as a second node N2, and the connection point between the control element 13 and the second resistor 16 and the fifth wiring 25 is referred to as a third node N3. In the following, the current flowing from the first node N1 to the third terminal 33 side is described as $I_{vref}$. The current $I_{vref}$ flowing from the first node N1 to the third terminal 33 side includes the current flowing through the control element 13 and the current flowing from the reference voltage generation circuit 11. In the following, the resistance value of the first resistor 15 is referred to as R1, and the resistance value of the second resistor 16 is referred to as R2. And, the wiring resistance of the portion of the second wiring 22 located between the first node N1 and the third terminal 33 is referred to as $R_{vrefgnd}$, the wiring resistance of the fifth wiring 25 is referred to as $R_{dc}$, and the wiring resistance of the seventh wiring 27 is referred to as $R_{dc,vrefgnd}$. In the following, the current flowing from the fifth wiring 25 to the seventh wiring 27 through the ADC 70 is described as $I_{dc}$. In this embodiment, as described above, the AC current becomes an instantaneous current flowing from the capacitor 50 to the sixth wiring 26 and the eighth wiring 28. Therefore, the wiring resistance of the sixth wiring 26 and the eighth wiring 28 through which the AC current flows, as well as the impact of the wiring drop caused by the AC current, can be considered negligible.

In this case, the potential of the first node N1 is indicated by $I_{vref}\times R_{vrefgnd}$, because the wiring resistance of the second wiring 22 is $R_{vrefgnd}$ and the current flowing through the second wiring 22 is $I_{vref}$. If the potential of the second node N2 and the third node N3 is V, the potential V, with the first node N1 as the reference, is represented by the following Equation 1.

$$V = V_{REF}\frac{R1 + R2}{R1} + I_{vref}R_{vrefgnd} \qquad \text{(Equation 1)}$$

As shown in FIG. 2, the potential on the side of the fifth wiring 25 in the first circuit 71 of the ADC 70 is referred to as $V_{vref,dc}$, and the potential on the side of the seventh wiring 27 is referred to as $V_{vrefgnd,dc}$. In addition, the potential on the sixth wiring 26 side in the second circuit 72 of the ADC 70 is denoted as $V_{vref,ac}$, and the potential on the eighth wiring 28 side is denoted as $V_{vrefgnd,ac}$. In this case, since the current flowing from the fifth wiring 25 through the ADC 70 to the seventh wiring 27 is Idc, the voltage supplied to the first circuit section 71 is represented by the following Equation 2. The voltage supplied to the second circuit section 72 is represented by the following Equation 3, assuming that the influence of wiring drops due to AC current can be ignored.

$$V_{vref,dc} - V_{vrefgnd,dc} = V_{REF}\frac{R1 + R2}{R1} + I_{vref}R_{vrefgnd} + I_{dc}R_{dc} - I_{dc}R_{dc,vrefgnd} \qquad \text{(Equation 2)}$$

$$V_{vref,ac} - V_{vrefgnd,ac} = V_{REF}\frac{R1 + R2}{R1} + I_{vref}R_{vrefgnd} \qquad \text{(Equation 3)}$$

Therefore, according to this embodiment, a highly accurate voltage, which has reduced the influence of wiring drops caused by the DC current flowing through the first circuit 71, is supplied to the second circuit 72.

According to the embodiment described above, the fifth wiring 25 and the seventh wiring 27, which are connected to the first circuit 71, and the sixth wiring 26 and the eighth wiring 28, which are connected to the second circuit 72, are isolated. Therefore, a voltage that has reduced the influence of the wiring drops caused by the current flowing through the first circuit 71 is supplied to the second circuit 72, and it is possible to suppress the voltage supplied to the second circuit 72 from changing due to the current flowing through the first circuit 71.

In this embodiment, the first to fourth terminals 31 to 34 and the first and second capacitance terminals 41 and 42 are provided, and the capacitor 50 is connected to the second circuit section 72 via the first to fourth terminals 31 to 34 and the first and second capacitance terminals 41 and 42. Therefore, compared to the case where the capacitor 50 is placed inside the IC chip, the flexibility in selecting the size and placement space of the capacitor 50 can be improved. Additionally, in this embodiment, the fifth wiring 25 and the sixth wiring 26 are separated, as well as the seventh wiring 27 and the eighth wiring 28 being separated, and the wiring to the second circuit section 72 that draws in the AC current is directly connected to the capacitor 50 (i.e., the capacitance). Therefore, the capacitor 50 can instantly supply current in response to voltage fluctuations caused by the AC current, allowing for further suppression of voltage fluctuations.

In this embodiment, the voltage reference circuit 10 and the first circuit 71 of the ADC 70 are connected via the fifth wiring 25, and no terminals or the like are arranged. Here, when the voltage reference circuit 10 and the ADC 70 are placed on a common IC chip as in this embodiment, generally, the voltage reference circuit 10 and the ADC 70 are placed approximately in the central part of the IC chip. The voltage reference circuit 10 and the ADC 70 are arranged such that the distance between the voltage reference circuit 10 and the ADC 70 is closer than the distance between the voltage reference circuit 10 and the ADC 70 and the first to fourth terminals 31 to 34. Therefore, it is easier to shorten the length of the fifth wiring 25. Additionally, in such a voltage measurement system, wiring tends to be densely packed around the first to fourth terminals 31 to 34. Therefore, by directly connecting the voltage reference circuit 10 and the first circuit 71 of the ADC 70 via the fifth wiring 25, it becomes easier to secure layout space.

Second Embodiment

The following describes a second embodiment of the present disclosure. In this embodiment, multiple ADCs 70 are provided in comparison to the first embodiment. As for other aspects, they are the same as in the first embodiment, and therefore, the explanation is omitted here.

Figure 3:
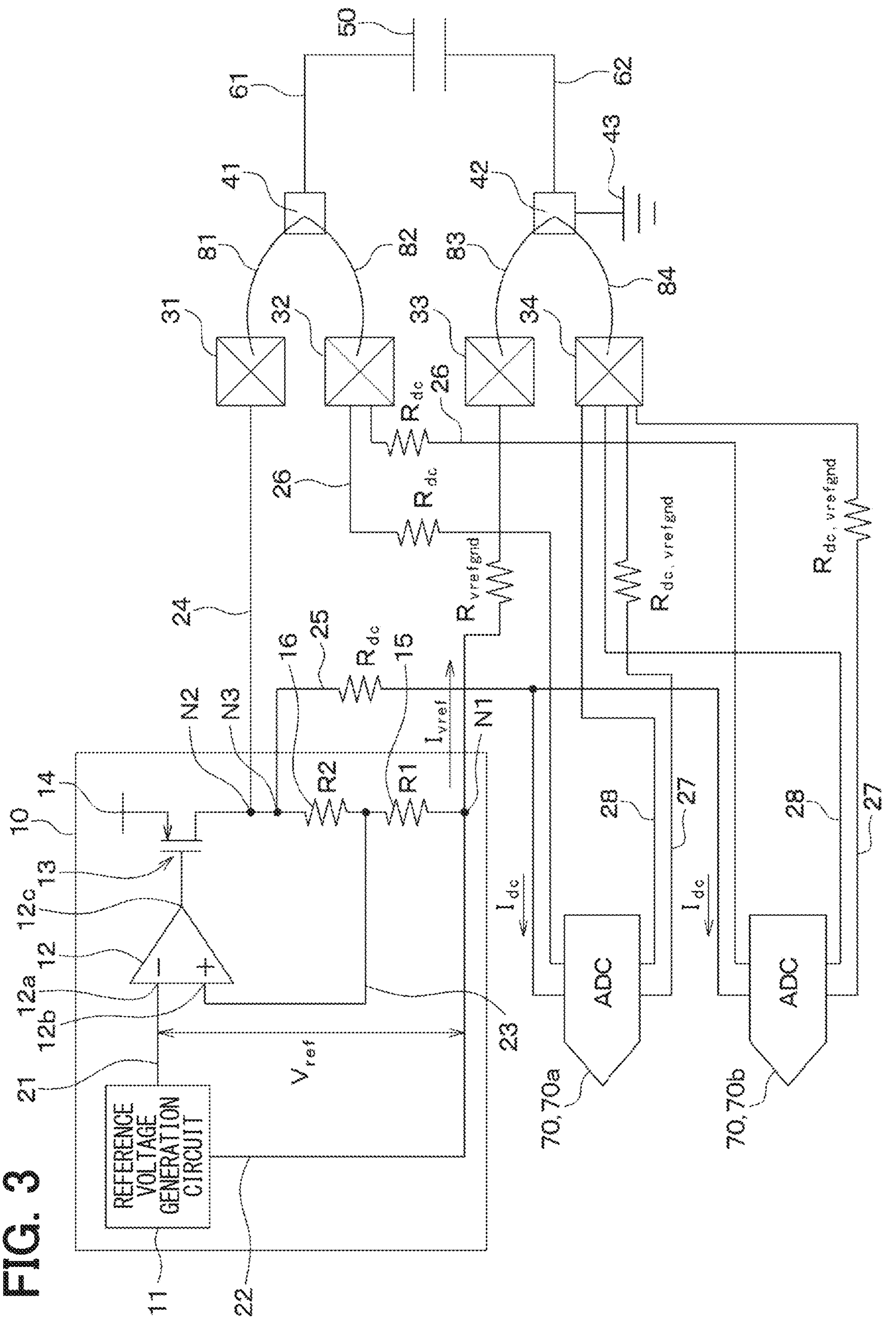
FIG. 3 is a schematic diagram of a voltage measurement system according to a second embodiment.

In the voltage measurement system according to this embodiment, as shown in FIG. 3, two ADCs 70 are provided. In the following, one of the ADCs 70 is referred to as a first ADC 70*a*, and another one of the ADCs 70 is referred to as a second ADC 70*b*. The first ADC 70*a* and the second ADC 70*b* have the same configuration as the ADC 70 described in the first embodiment.

Two sixth wirings 26 are connected to the second terminal 32. One of the sixth wirings 26 is connected to the second circuit 72 in the first ADC 70*a*, and another one of the sixth wirings 26 is connected to the second circuit 72 in the second ADC 70*b*. Two seventh wirings 27 are connected to the fourth terminal 34, one of which is connected to the first circuit 71 in the first ADC 70*a*, and the other is connected to the first circuit 71 in the second ADC 70*b*. Two eighth wirings 28 are connected to the fourth terminal 34, one of which is connected to the second circuit 72 in the first ADC 70*a*, and the other is connected to the second circuit 72 in the second ADC 70*b*.

In this embodiment, the fifth wiring 25 is split into two on the IC chip, with one part of the fifth wiring 25 connected to the first circuit 71 in the first ADC 70*a*, and the other part of the fifth wiring 25 connected to the first circuit 71 in the second ADC 70*b*.

The above is the configuration of the voltage measurement system in this embodiment. In such a voltage measurement system, since it is equipped with multiple ADCs 70, the voltage supplied to the first circuit 71 is represented by the following Equation 4.

$$V_{vref,dc} - V_{vrefgnd,dc} = V_{REF}\frac{R1+R2}{R1} + I_{vref}R_{vrefgnd} + NI_{dc}R_{dc} - I_{dc}R_{dc,vrefgnd} \quad \text{(Equation 4)}$$

It should be noted that "N" in the third term on the right-hand side of Equation 4 represents the number of ADCs 70. In this embodiment, since the first ADC 70*a* and the second ADC 70*b* are provided, N is 2. In other words, when multiple ADCs 70 are provided, as indicated in the above Equation 4, it is confirmed that the voltage supplied to the first circuit 71 increases in error as the number of ADCs 70 increases. However, in this embodiment, as described above, the fifth wiring 25 and the seventh wiring 27, through which DC current flows, are isolated from the sixth wiring 26 and the eighth wiring 28, through which AC current flows. Therefore, the voltage supplied to the second circuit 72 is the same as in the above Equation 3. Therefore, according to this embodiment, even if the number of ADCs 70 is increased, it is possible to suppress the voltage supplied to the second circuit 72 from being affected by the current flowing through the first circuit 71.

According to the embodiment described above, the fifth wiring 25 and the seventh wiring 27, which are connected to the first circuit 71, and the sixth wiring 26 and the eighth wiring 28, which are connected to the second circuit 72, are isolated. Therefore, effects similar to those of the first embodiment can be obtained.

In this embodiment, although multiple ADCs 70 are provided, the fifth wiring 25 and the seventh wiring 27 connected to the first circuit 71, and the sixth wiring 26 and the eighth wiring 28 connected to the second circuit 72 are isolated. Therefore, even if the number of ADCs 70 operating in the system changes, it is possible to suppress the voltage supplied to the second circuit 72 from being affected by the current flowing through the first circuit 71.

Third Embodiment

The following describes a third embodiment. The present embodiment is different from the first embodiment in the configuration of the voltage reference circuit 10. As for other aspects, they are the same as in the first embodiment, and therefore, the explanation is omitted here.

Figure 4:
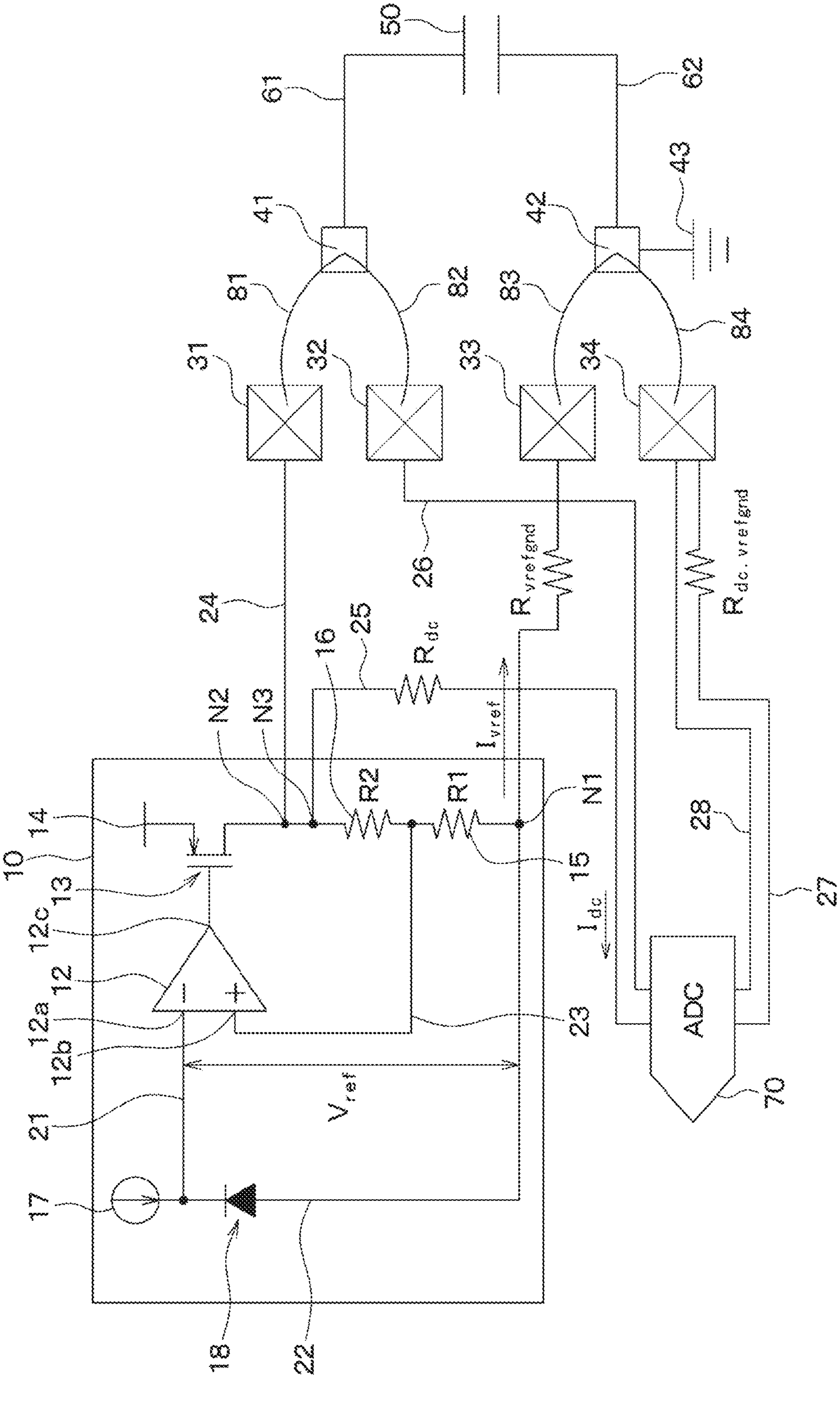
FIG. 4 is a schematic diagram of a voltage measurement system according to a third embodiment.

In this embodiment, as shown in FIG. 4, the voltage reference circuit 10 includes a constant current source 17 and a Zener diode 18 instead of the reference voltage generation circuit 11. Specifically, the Zener diode 18 has its cathode side connected to the constant current source 17, and its anode side connected to the second wiring 22. Then, the first wiring 21 is connected between the constant current source 17 and the Zener diode 18.

According to the embodiment described above, the fifth wiring 25 and the seventh wiring 27, which are connected to the first circuit 71, and the sixth wiring 26 and the eighth wiring 28, which are connected to the second circuit 72, are isolated from each other. Therefore, effects similar to those of the first embodiment can be obtained.

In this embodiment, the reference voltage Vref is generated according to the breakdown voltage of the Zener diode 18. Therefore, it becomes easier to generate a highly accurate reference voltage Vref, and variations in the reference voltage Vref can be suppressed.

Fourth Embodiment

The following describes a fourth embodiment. This embodiment modifies the first embodiment by changing the connection point of the eighth wiring 28. As for other aspects, they are the same as in the first embodiment, and therefore, the explanation is omitted here.

Figure 5:
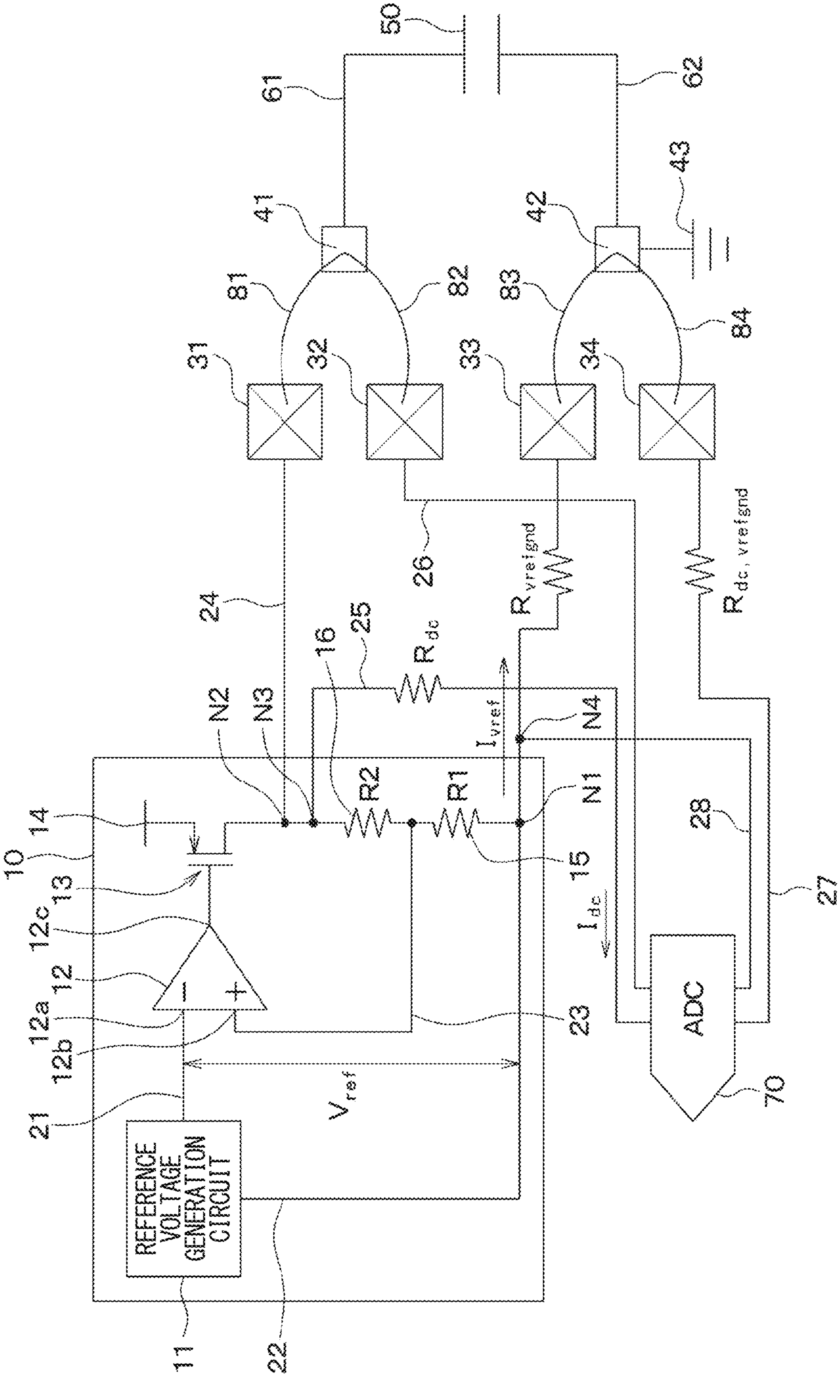
FIG. 5 is a schematic diagram of a voltage measurement system according to a fourth embodiment.

In this embodiment, as shown in FIG. 5, the eighth wiring 28 is arranged to connect the second circuit 72 of the ADC 70 with the first node N1 of the second wiring 22 and the third terminal 33. Therefore, if the connection point between the eighth wiring 28 and the second wiring 22 is set to the fourth node N4, the potential on the low potential side in the second circuit 72 will be closer to the potential of the first node N1. Therefore, for example, if the potential of the fourth node N4 is the same as the potential of the first node N1, the voltage applied to the second circuit 72 is represented by Equation 5 below.

$$V_{vref,ac} - V_{vrefgnd,ac} = V_{REF}\frac{R1+R2}{R1} + I_{vref}R_{vrefgnd} - I_{vref}R_{dc,vrefgnd} = V_{REF}\frac{R1+R2}{R1} \quad \text{(Equation 5)}$$

Therefore, according to this embodiment, the voltage supplied to the second circuit 72 can be prevented from being affected by the current $I_{vref}$ flowing through the second wiring 22.

According to the embodiment described above, the fifth wiring 25 and the seventh wiring 27, which are connected to the first circuit 71, and the sixth wiring 26 and the eighth wiring 28, which are connected to the second circuit 72, are arranged separately. Therefore, effects similar to those of the first embodiment can be obtained.

In this embodiment, the eighth wiring 28 is arranged to connect the second circuit 72 of the ADC 70 with the first node N1 of the second wiring 22 and the third terminal 33. Therefore, the influence of the current $I_{vref}$ flowing through the second wiring 22 can also be reduced.

OTHER EMBODIMENTS

Although the present disclosure has been described in accordance with the embodiments, it is understood that the present disclosure is not limited to the embodiments or the structures. The present disclosure includes various modification examples and modifications within the equivalent scope. Various combinations or forms as well as other combinations or forms including only one element, one or more elements, or fewer elements fall within the scope or the concept of the present disclosure.

In the above embodiments, an example was described where the first voltage is a constant DC voltage and the second voltage is an instantaneous AC voltage superimposed on the DC voltage. However, depending on the circuit configuration, the first voltage and the second voltage may both be constant DC voltages, or they may both be instantaneous AC voltages superimposed on the DC voltage.

In the above embodiments, the ADC 70 having the first circuit 71 and the second circuit 72 was described as an example. However, as long as the ADC includes the first circuit 71 and the second circuit 72 that requires a higher accuracy voltage than the first circuit 71, other configurations can be modified as appropriate. For example, instead of the ADC 70, another component that has the first circuit 71 and the second circuit 72 may be provided, or the first circuit 71 and the second circuit 72 may be included in separate components.

Furthermore, in the above embodiments, the capacitor 50 may be arranged on the IC chip along with the voltage reference circuit 10 and the ADC 70. In this configuration, since the capacitor 50 is also arranged on the IC chip, the first to fourth terminals 31 to 34 and the first and second capacitance terminals 41 and 42 may not be necessary.

In addition, each of the above embodiments can be combined as appropriate. For example, the above two embodiments may be combined with the third and fourth embodiments, so that multiple ADC 70*s* are provided. Additionally, the third embodiment may be combined with the fourth embodiment, providing a constant current source 17 and a Zener diode 18 instead of the reference voltage generation circuit 11.

What is claimed is:

1. A voltage measurement system comprising:

a voltage reference circuit configured to generate a reference voltage;

an additional circuit configured to receive a voltage based on the reference voltage, the additional circuit including a first circuit configured to receive a first voltage that is a voltage based on a reference voltage, and a second circuit configured to receive a second voltage that is a voltage based on a reference voltage having a higher accuracy than the reference voltage in the first circuit;

a first high-potential wiring and a first low-potential wiring connected to each other through the first circuit, the first high-potential wiring and the first low-potential wiring configured to apply the first voltage to the first circuit; and a second high-potential wiring and a second low-potential wiring connected to each other through the second circuit, the second high-potential wiring and the second low-potential wiring configured to apply the second voltage to the second circuit, wherein the first high-potential wiring and the second high-potential wiring are isolated from each other, and the first low-potential wiring and the second low-potential wiring are isolated from each other.

2. The voltage measurement system according to claim 1, wherein the additional circuit is an analog-to-digital converter having the first circuit and the second circuit, the first circuit includes a resistive divider, and the second circuit includes an arithmetic unit.

3. The voltage measurement system according to claim 2, wherein a plurality of analog-to-digital converters is provided.

4. The voltage measurement system according to claim 1, wherein the voltage reference circuit includes a Zener diode, and is configured to generate the reference voltage based on a breakdown voltage of the Zener diode.

5. The voltage measurement system according to claim 1, further comprising:

a first capacitance terminal;

a second capacitance terminal connected to a ground;

a capacitor connected between the first capacitance terminal and the second capacitance terminal;

a first terminal connected to the voltage reference circuit and the first capacitance terminal;

a second terminal connected to the second circuit via the second high-potential wiring, and connected to the first capacitance terminal;

a third terminal connected to the voltage reference circuit and the second capacitance terminal;

a fourth terminal connected to the first circuit via the first low-potential wiring, and connected to the second capacitance terminal, wherein the second circuit is configured to receive an AC current from the capacitor.

6. The voltage measurement system according to claim 5, wherein the second low-potential wiring is connected to the second circuit and the fourth terminal.

7. The voltage measurement system according to claim 5, wherein the second low-potential wiring is connected to the second circuit, and is connected to another wiring that connects the third terminal to the voltage reference circuit.

* * * * *